(12) United States Patent
Ren et al.

(10) Patent No.: US 7,087,972 B1
(45) Date of Patent: Aug. 8, 2006

(54) MAGNETOELECTRONIC DEVICES UTILIZING PROTECTIVE CAPPING LAYERS AND METHODS OF FABRICATING THE SAME

(75) Inventors: J. Jack Ren, Phoenix, AZ (US); Brian R. Butcher, Gilbert, AZ (US); Mark A. Durlam, Chandler, AZ (US); Gregory W. Grynkewich, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/048,015

(22) Filed: Jan. 31, 2005

(51) Int. Cl.
*H01L 29/82* (2006.01)
(52) U.S. Cl. .............................. 257/421; 438/3; 366/66
(58) Field of Classification Search ................ 257/421, 257/422, E21.665; 438/3; 265/66, 69
See application file for complete search history.

(56) References Cited

U.S. PATENT DOCUMENTS

| | | |
|---|---|---|
| 5,017,516 A | 5/1991 | van der Putten |
| 5,039,655 A | 8/1991 | Pisharody |
| 6,054,329 A | 4/2000 | Burghartz et al. |
| 6,211,090 B1 | 4/2001 | Durlam et al. |
| 6,555,858 B1 | 4/2003 | Jones et al. |
| 6,784,510 B1 * | 8/2004 | Grynkewich et al. ........ 257/421 |
| 6,890,770 B1 * | 5/2005 | Grynkewich et al. .......... 438/3 |

FOREIGN PATENT DOCUMENTS

| | | |
|---|---|---|
| WO | WO 02/058135 A2 | 7/2002 |
| WO | WO 02/058135 A3 | 7/2002 |

* cited by examiner

*Primary Examiner*—Sara Crane
(74) *Attorney, Agent, or Firm*—Ingrassia, Fisher & Lorenz (57) ABSTRACT

Magnetoelectronic device structures and methods for fabricating the same are provided. One method comprises forming a first and a second conductor. The first conductor is electrically coupled to an interconnect stack. A first insulating layer is deposited overlying the first conductor and the second conductor. A via is etched to substantially expose the first conductor. A protective capping layer is deposited by electroless deposition within the via and is electrically coupled to the first conductor. A magnetic memory element layer is formed within the via and overlying the second insulating layer and the second conductor.

20 Claims, 6 Drawing Sheets

MAGNETOELECTRONIC DEVICES UTILIZING PROTECTIVE CAPPING LAYERS AND METHODS OF FABRICATING THE SAME

FIELD OF THE INVENTION

The present invention generally relates to magnetoelectronic devices, and more particularly relates to magnetoelectronic devices utilizing protective capping layers overlying conductive lines and methods for fabricating such magnetoelectronic devices utilizing electroless plating.

BACKGROUND OF THE INVENTION

Magnetoelectronic devices, spin electronics devices, and spintronics devices are synonymous terms for devices that use effects predominantly caused by electron spin. Magnetoelectronic effects are used in numerous information devices, and provide non-volatile, reliable, radiation resistant, and high-density data storage and retrieval. The numerous magnetoelectronic information devices include, but are not limited to, magnetic random access memory (MRAM), magnetic sensors, and read/write heads for disk drives.

Generally, a magnetoelectronic information device is constructed with an array of memory elements (e.g., giant magnetoresistance (GMR) elements or magnetic tunnel junction (MTJ) elements) formed overlying a substrate that may also include a variety of semiconductor devices, such as, for example, metal-oxide-semiconductor field effect transistors (MOSFETs). The memory elements are programmed by the magnetic field created from current-carrying conductors, typically copper conductors. Two current-carrying copper conductors, one formed underneath the memory element (the digit line) and one formed overlying the memory element (the bit line), are arranged in a cross point matrix to provide magnetic fields for programming of the memory element.

Typically during the fabrication of the memory element array, copper digit lines, which will underlie the memory elements, are formed by a damascene process or inlaid process during which trenches are patterned and etched in a dielectric layer, followed by the deposition of metal within the trenches. Simultaneously with the fabrication of the copper digit lines, copper interconnect lines may also be fabricated using the same damascene process. Each copper interconnect line forms part of an interconnect stack that electrically couples a memory element to a transistor, typically an N-channel field effect transistor (FET).

After fabrication of the copper digit lines and copper interconnect lines, a dielectric material typically is deposited over the digit lines and interconnect lines, and vias are etched to each of the copper interconnect lines of the interconnect stacks. A first electrode layer then may be deposited overlying the dielectric layer and within the vias, followed by the deposition of the magnetic materials that will form the memory element. A second electrode layer may be deposited overlying the magnetic materials and the second electrode layer and the magnetic materials then may be etched to form a memory element that is magnetically coupled to the digit line and electrically coupled to the copper interconnect line.

However, a number of adverse reactions may occur with the above-described method for forming a magnetoelectronic memory element array, each directly related to the use of copper as the interconnect line. One adverse reaction is the corrosion of the magnetic materials by the copper. If the step coverage of the first electrode layer is not adequate within a via, the copper of the underlying interconnect line may be exposed to the magnetic materials of the memory element. When the copper contacts the magnetic materials, a galvanic cell may form and, in the presence of moisture present in the ambient environment, the copper may corrode the magnetic material. Once the corrosion starts, it may spread quickly and, consequently, may destroy a number of memory elements of the array.

In addition, after formation of the memory element array, the memory elements typically are separated from one another by an etching process. Because of the tight tolerances of the fabrication process, it is often difficult to perform the etching process without etching the copper interconnect lines. If there is misalignment in the etching process and the copper is contacted by the etchant, the copper may be damaged by reaction with the etchant.

Another adverse reaction that may result is the destruction of the conductivity of the copper interconnect line due to exposure to an oxygen plasma. Oxygen plasma often is used during various stages of the array fabrication, such as during removal of photoresist after formation of vias. If the copper is contacted by the oxygen plasma, it may be oxidized and, hence, loose its conductive properties.

Yet another adverse reaction results from hillocks that form on the top, exposed surface of the copper lines and layers. Hillocks generally do not pose a problem during semiconductor fabrication because layers overlying the copper interconnect lines typically are of materials that do not react with copper and are thick enough to cover and separate the hillocks from other materials that may cause a reaction. However, during fabrication of a magnetoelectronic memory array, the dielectric layer that separates a copper digit line from the magnetic materials of the memory elements typically is very thin, on the order of about 50 nanometers to 200 nanometers. Because the first electrode layer of the memory element also is relatively thin (i.e., 10 to 100 nanometers), copper hillocks formed on a digit line can be large enough to extend through the dielectric layer and first electrode layer and into the magnetic materials of the memory element and, consequently, corrode the memory elements.

Accordingly, it is desirable to provide a magnetoelectronic memory device that can be manufactured without the undesirable problems described above. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Turning now to the figures, FIGS. 1–8 illustrate a method for fabricating a magnetoelectronic device structure in accordance with an exemplary embodiment of the present invention. The method utilizes a protective capping layer to protect an underlying copper conductor and to protect overlying magnetic material.

Figure 1:
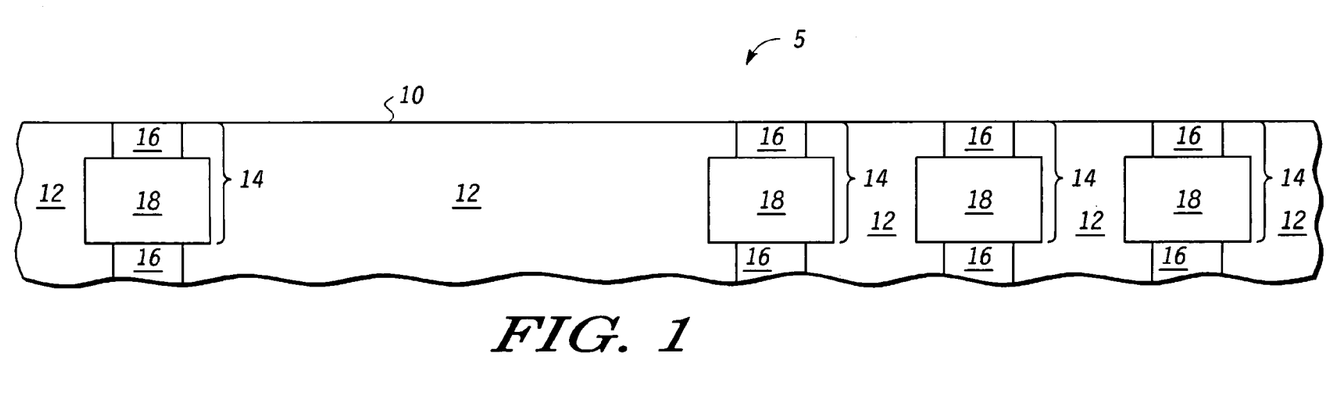
FIGS. 1–8 illustrate a method for fabricating a magnetoelectronic device in accordance with an exemplary embodiment of the present invention.

FIG. 1 is a cross-sectional view of a section 10 of a partially fabricated array of an magnetoelectronic device 5. The method may include fabricating an interconnect stack 14 of vias 16 and metallization layers 18 in a line and stack formation overlying a substrate (not shown). Interconnect stack 14 is fabricated so as to be disposed within one or more dielectric layers 12 and is formed by providing dielectric layers, masking and etching, and metal deposition, all in a well-known manner. As used herein, the term "layer" means one layer or a combination or plurality of sub-layers. Interconnect stack 14 provides the interconnections between integrated circuitry, such as transistors, formed within or overlying the substrate and the magnetoelectronic device array in which section 10 is included.

Figure 2:
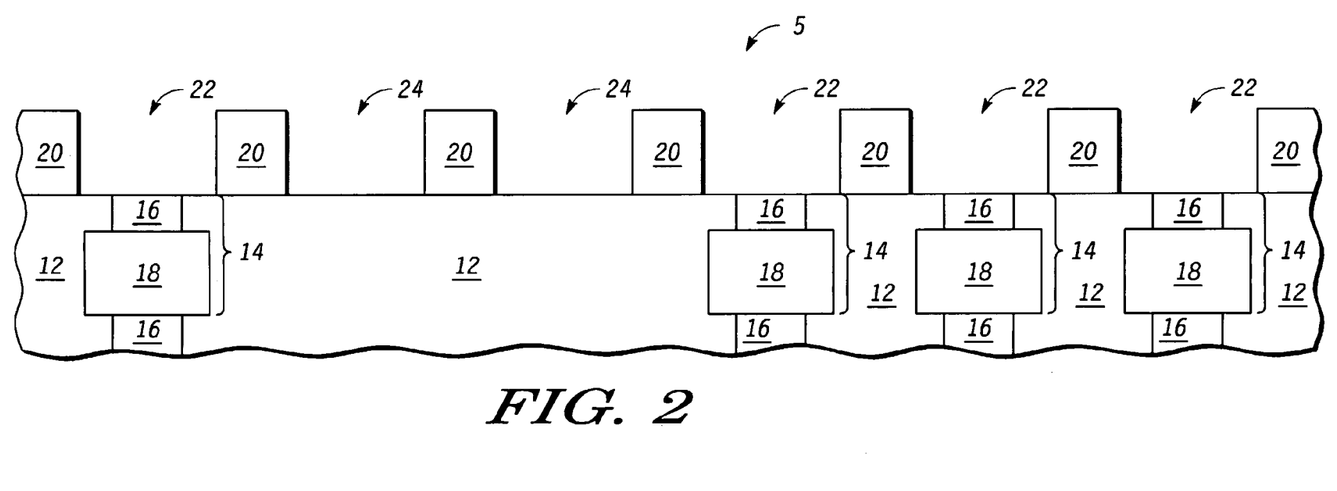

Referring to FIG. 2, a first insulating layer 20 is deposited overlying section 10 and patterned. First insulating material layer 20 may comprise any suitable dielectric material such as, for example, tetraethyl orthosilicate (TEOS)-derived silicon dioxide, plasma-enhanced nitride (PEN), silicon nitride ($Si_3N_4$), silicon dioxide ($SiO_2$), the like, or any combination thereof. First insulating layer 20 is suitably patterned and etched, in accordance with standard and well known semiconductor processes, to form a first trench 22 that exposes interconnect 14 and to form a second trench 24 substantially overlying dielectric layer 12. For example, a photoresist layer (not shown) may be formed overlying first insulating layer 20 and developed using standard photolithography techniques so that first insulating layer 20 may be etched using a suitable wet or dry etch chemistry to form first trench 22 and second trench 24. First trench 22 and second trench 24 extend perpendicular to FIG. 2.

Figure 3:
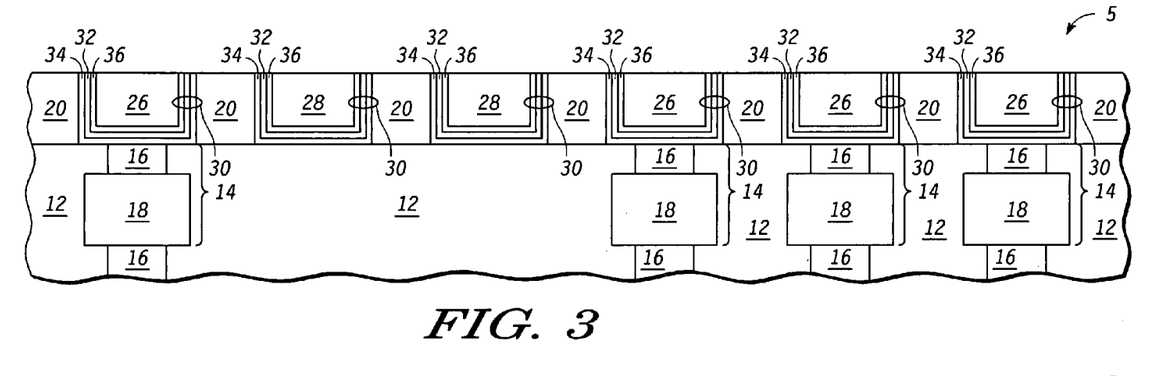

Referring to FIG. 3, a conductive material is deposited within first trench 22 and second trench 24 using any suitable deposition process, such as, for example, chemical vapor deposition (CVD), physical vapor deposition (PVD), ion beam deposition (IBD), atomic layer deposition (ALD), electroplating, the like, or combinations of the above. The conductive material may comprise any suitable conductive material, such as, for example, copper, aluminum, gold, the like, or any combination or alloy thereof. Preferably, the conductive material is copper. For convenience and the sake of illustration, the embodiments of the present invention will be described hereinafter with reference to copper as the conductive material, although it will be understood that any suitable conductive material may be used. Excess copper formed overlying first insulating layer 20 then may be removed by any suitable technique, such as chemical mechanical polishing (CMP), electrochemical mechanical polishing (ECMP), sputtering, etching, the like, or combinations of the above to form a first copper conductor 26 that is disposed within first trench 22 and that is electrically coupled to interconnect stack 14. Removal of the excess copper also forms a second copper conductor, or digit line, 28 disposed within second trench 24 and to be associated with a subsequently formed memory element, described in more detail below In another exemplary embodiment of the invention, a cladding layer 30 may be deposited within second trench 24 prior to deposition of digit line 28 into trench 24, as shown in FIG. 3. To simplify fabrication of the magnetoelectronic device 5, cladding layer 30 may be deposited within first trench 22 at the same time that cladding layer 30 is deposited within second trench 24. Cladding layer 30 serves to focus the magnetic flux generated when a current is applied to digit line 28. Cladding layer 30 may be formed using conventional methods that are well known in the semiconductor industry. In one embodiment of the invention, cladding layer 30 comprises a flux concentrating layer 32. Flux concentrating layer 32 may comprise any suitable material that has the characteristic of concentrating magnetic flux produced by the current flowing in digit line 28. Flux concentrating layer 32 is an electrically conducting magnetic material having high permeability, such as nickel iron (NiFe) of any suitable proportion of nickel and iron, or any suitable material having sufficiently high permeability to concentrate the magnetic flux in the desired area and be metallurgically compatible with the material structure.

In another embodiment of the invention, cladding layer 30 may comprise a first barrier layer 34 that prevents or reduces diffusion of copper from first copper conductor 26 and from digit line 28. First barrier layer 34 may comprise cobalt (Co), cobalt iron (CoFe), tantalum (Ta), tantalum nitride (TaN), or other suitable material. In a further embodiment of the invention, cladding layer 30 may comprise a second barrier layer 36, which serves as a barrier between first copper conductor 26 and flux concentrating layer 32 and between digit line 28 and flux concentrating layer 32. Second barrier layer 36 may be formed of Ta, TaN, tantalum silicon nitride (TaSiN), or other similar material.

Figure 4:
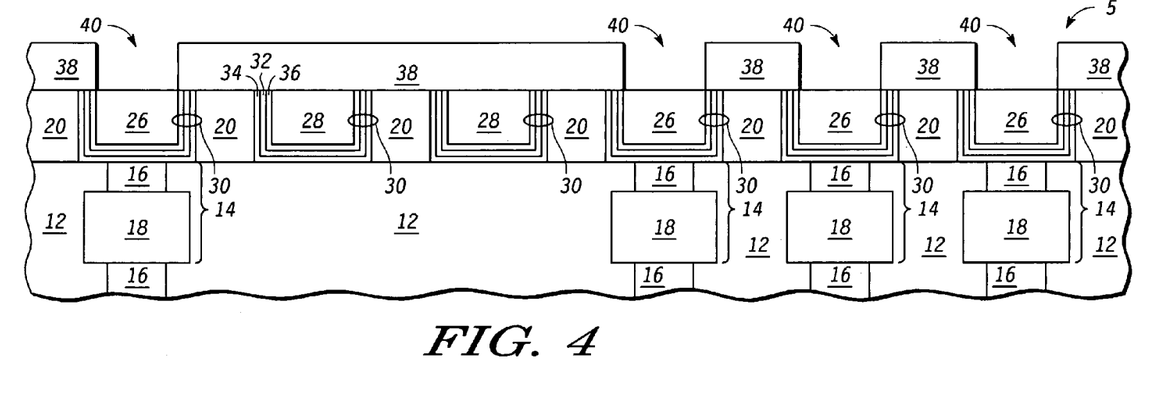

As illustrated in FIG. 4, after formation of first copper conductor 26 and digit line 28, a second insulating layer 38 is deposited globally over first insulating layer 20, first copper conductor 26, and digit line 28 and subsequently patterned. Second insulating layer 38 may be formed of any suitable dielectric material or materials, such as (TEOS)-derived silicon dioxide, PEN, $Si_3N_4$, $SiO_2$, or the like or any combination thereof. As described in more detail below, second insulating layer 38 will be disposed between digit line 28 and a subsequently formed memory element. Accordingly, second insulating layer 38 has a thickness less than a thickness that would adversely affect the magnetic coupling between digit line 28 and a subsequently-formed memory element. In a preferred embodiment of the invention, second insulating layer 38 has a thickness in the range of about 50 to about 200 nanometers. Second insulating layer 38 then may be suitably patterned and etched using standard masking and etching techniques to form a via 40 that extends to and that substantially exposes first copper conductor 26. It will be appreciated that second insulating layer 38 may be etched to selectively form vias to other interconnects or conductors and to leave other interconnects and conductors, such as digit line 28, unexposed.

Figure 5:
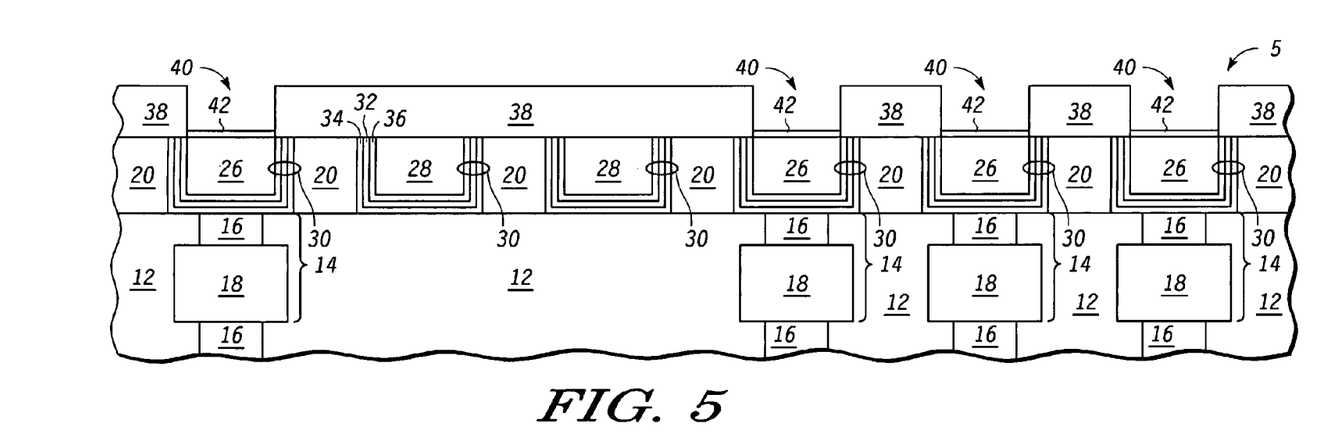

Referring to FIG. 5, after formation of via 40, a protective capping layer 42 may be deposited within via 40 and overlying first copper conductor 26 using electroless deposition. Electroless deposition, also known as electroless plating, involves an autocatalyzed chemical deposition process that does not require an applied current for the reaction to occur. It is a self-aligned and self-limiting process that permits the deposition of materials, even in features with small or narrow dimensions, with step coverage that exceeds the step coverage resulting from deposition processes such as chemical vapor deposition and physical vapor deposition. Electroless deposition of protective capping layer 42 causes the protective capping layer 42 to be deposited on first copper conductor 26 with a sufficient step coverage that first copper conductor 26 is substantially insulated from subsequently deposited magnetic materials, discussed in more detail below, and from reactive chemistries used in subsequent processes. Protective capping layer 42 may be comprised of any conductive material that is not reactive with copper (or other conductive material, if used), that will selectively plate on copper (or other conductive material, if used), and that is inert to etching chemistries used in subsequent processes. Examples of materials suitable for protective capping layer 42 include noble metals, such as palladium, platinum, and ruthenium, and alloys thereof, and semi-noble metals, such as cobalt, nickel, and tungsten, and alloys thereof, such as nickel phosphorous (NiP), cobalt tungsten phosphorous (CoWP), cobalt iron boron (CoFeB), and nickel iron (NiFe).

Figure 6:
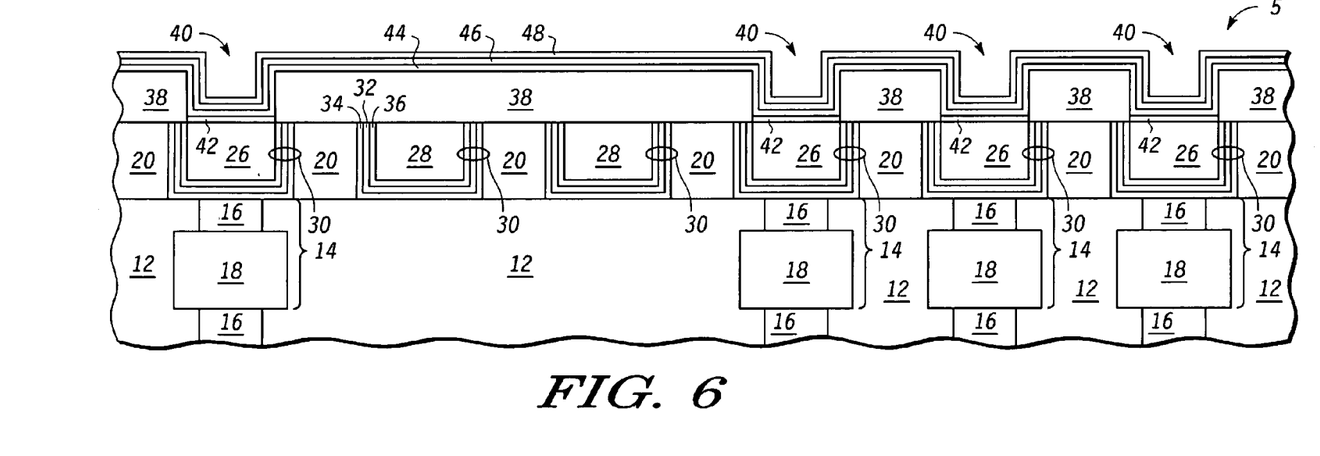

After the electroless deposition of protective capping layer 42, as illustrated in FIG. 6, a first conductive layer 44, a memory element layer 46, and a second conductive layer 48 may be formed overlying second insulating layer 38, within vias 40, and overlying protective capping layer 42. First conductive layer 44 comprises a non-magnetic conductor forming a lower electrical contact for a memory element to be subsequently formed and is deposited to a thickness in the range of about 10 to about 200 nanometers. First conductive layer 44 can be formed of any suitable electrically conductive material or materials. Preferably, first conductive layer 44 is formed of tantalum (Ta), tungsten (W), titanium (Ti), aluminum (Al), tantalum nitride (TaN), or combinations or alloys thereof. More preferably, first conductive layer 44 is formed of tantalum. Memory element layer 46 comprises materials that form the memory element, to be formed subsequently. Particularly, memory element layer 46 comprises a first magnetic layer and a second magnetic layer that utilize magnetic material such as cobalt iron (CoFe) and/or nickel iron cobalt (NiFeCo). A separating layer is sandwiched between the first and second magnetic layers. In memory elements such as GMR's, the separating layer may be a conductive, non-magnetic material. In memory elements such as MTJ's, the separating layer may be a non-conductive, non-magnetic material, such as, for example, aluminum oxide (AlOx, where $0 \leq x \leq 1.5$). The layers in the memory element layer 46 are thin with the magnetic layers varying from about 0.5 to 40 nanometers and the separating layer varying from 0.5 to 5 nanometers. Second conductive layer 48 is deposited overlying memory element layer 46. Second conductive layer 48 has a thickness in the range of about 10 to about 200 nanometers. Second conductive layer 48 can be formed of any suitable electrically conductive materials. Preferably, second conductive layer 48 is formed of tantalum, tungsten, titanium, aluminum, tantalum nitride, or combinations or alloys thereof. More preferably, second conductive layer 48 is formed of tantalum.

Figure 7:
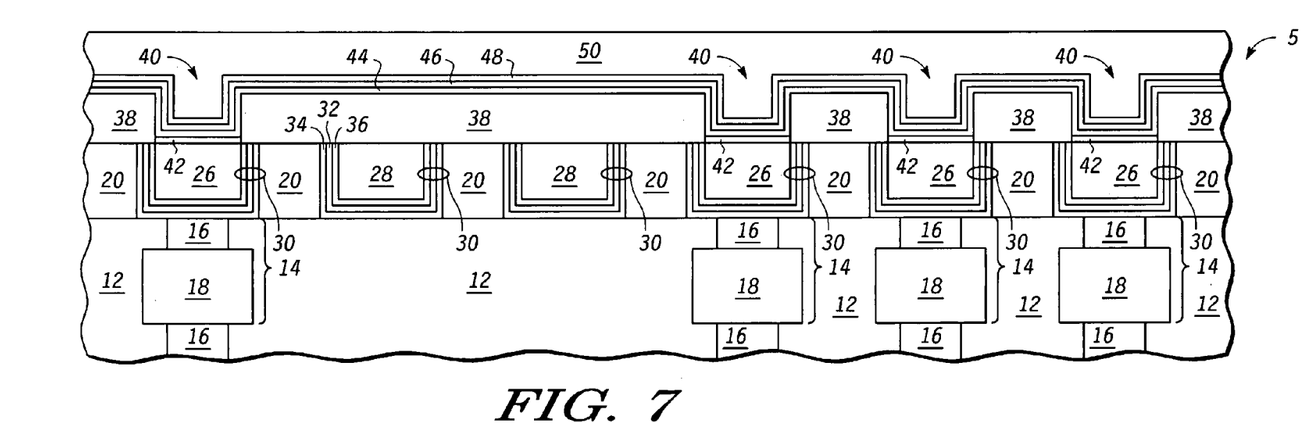
Figure 8:
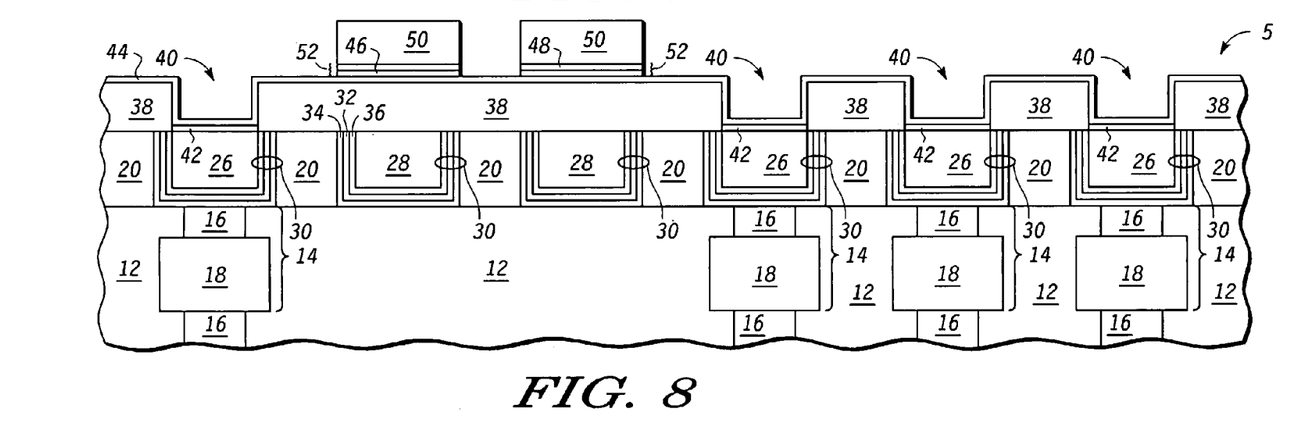

Referring to FIGS. 7 and 8, a masking layer 50, such as a hard mask, then may be deposited overlying second conductive layer 48 and patterned and etched using standard and well-known techniques. Second conductive layer 48 and magnetic memory element layer 46 then may be suitably etched to form memory element 52 overlying digit line 28. Memory element 52 is disposed overlying digit line 28 so as to be magnetically coupled to digit line 28. In addition, memory element 52 is electrically coupled to interconnect 14 through first conductive layer 44 which extends from memory element 52 to protective capping layer 42 and, hence, to interconnect 14.

FIGS. 9–12 illustrate a method for fabricating a magnetoelectronic device 95 in accordance with another exemplary embodiment of the present invention. Elements of FIGS. 9–12 that have the same reference numbers as elements of FIGS. 1–8 are the same corresponding FIGS. 1–8 elements. The method may include utilizing the same steps as described above with reference to FIGS. 1–3, that is, a first copper conductor 26 is fabricated so as to be electrically coupled to an interconnect stack 14 and a second copper conductor, or digit line 28 is fabricated with first copper conductor 26. Both first copper conductor 26 and digit line 28 are fabricated within a first insulating layer 20.

Figure 9:
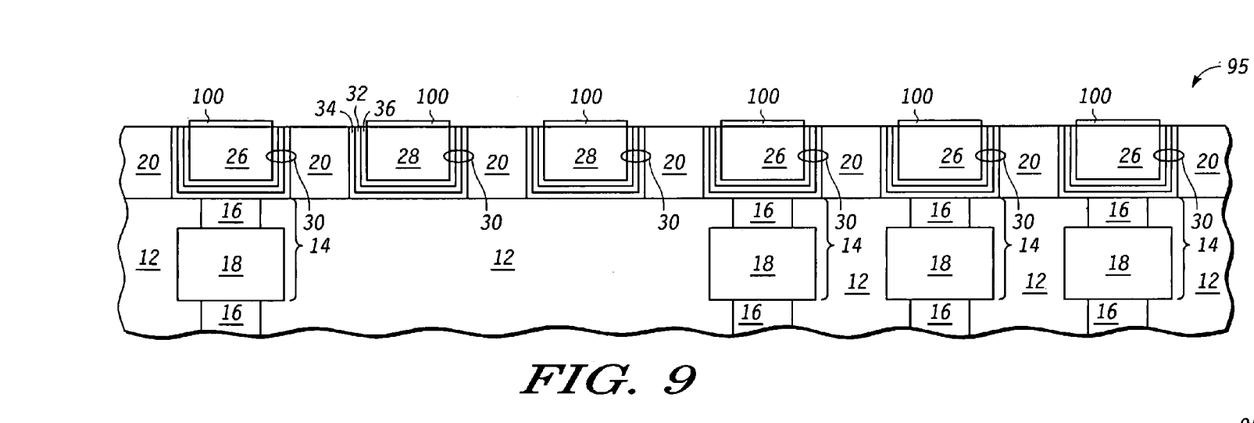
FIGS. 9–12 illustrate a method for fabricating a magnetoelectronic device in accordance with another exemplary embodiment of the present invention.

Referring now to FIG. 9, after formation of the copper conductors 26 and 28, a protective capping layer 100 may be deposited overlying first copper conductor 26 and digit line 28 using electroless deposition. As described above, electroless deposition is a self-aligning process. Accordingly, the protective capping layers 100 are deposited on the exposed copper of the copper conductors, leaving the cladding layers 30, if present, and first insulating layer 20 substantially exposed. Electroless deposition of protective capping layers 100 causes the protective capping layers 100 to be deposited on first copper conductor 26 and second copper conductor 28 with a sufficient step coverage that first copper conductor 26 and second copper conductor 28 are substantially insulated from subsequently deposited magnetic materials and from reactive chemistries used in subsequent processes. Protective capping layers 100 may be comprised of any conductive, nonmagnetic or magnetically inactive material that is not reactive with copper (or other conductive material, if used), that will selectively plate on copper (or other conductive material, if used), and that is inert to etching chemistries used in subsequent processes. Examples of materials suitable for protective capping layers 100 include platinum, palladium, ruthenium, alloys of platinum, alloys of palladium, alloys of ruthenium, and nickel phosphorous. As discussed in more detail below, protective capping layers 100 are subsequently subjected to an etching process(es). The protective capping layers 100 also may be subjected to one or more cleaning processes, such as sputtering. Accordingly, in one embodiment of the invention, protective capping layers 100 may have a thickness sufficient to withstand an etching process(es) and a cleaning process(es) such that first copper conductor 26 and second copper conductor 28 are not exposed after the etching process(es) or cleaning process(es). However, as further illustrated below, certain of the protective capping layers 100 are fabricated between a memory element and a digit line. In this regard, protective capping layers 100 have a thickness less than a thickness that would interfere with the magnetic coupling between the memory element and digit line 28. In a preferred embodiment of the invention, capping layers 100 are deposited to a thickness no less than about 20 nanometer. In a more preferred embodiment of the invention, capping layers 100 are deposited to a thickness in the range of about 20 to about 50 nanometers.

Figure 10:
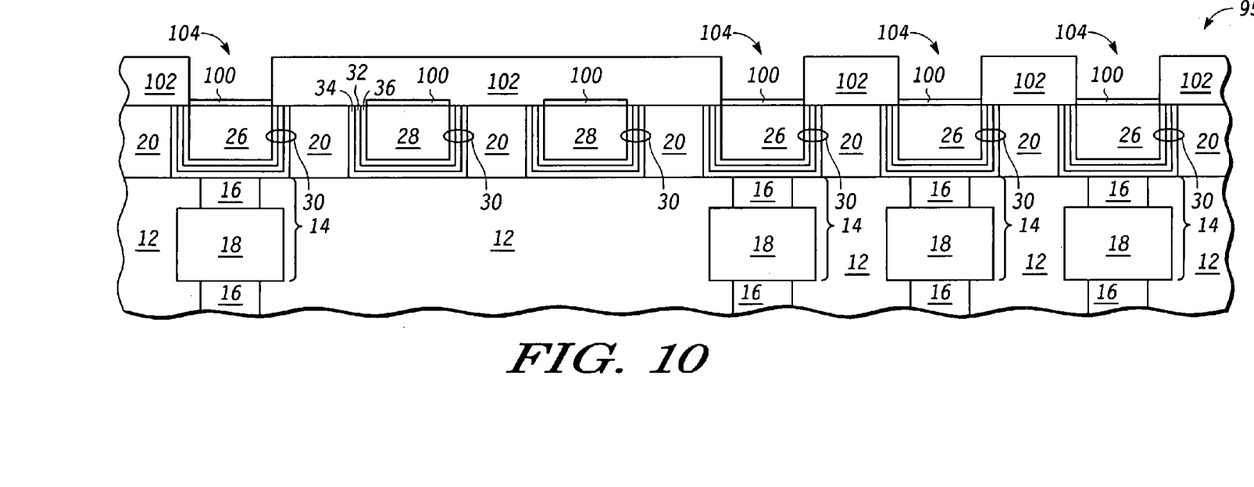

As illustrated in FIG. 10, after formation of protective capping layers 100, a second insulating layer 102 is globally deposited overlying first insulating layer 20 and protective capping layers 100. Second insulating layer 102 may be formed of any suitable dielectric material or materials, such as (TEOS)-derived silicon dioxide, PEN, $Si_3N_4$, $SiO_2$, or the like, or any combination thereof. As described in more detail below, second insulating layer 102 will be disposed between digit line 28 and a subsequently formed memory element. Accordingly, second insulating layer 102 has a thickness less than a thickness that would adversely affect the magnetic coupling between digit line 28 and a subsequently-formed memory element. In a preferred embodiment of the invention, second insulating layer 102 has a thickness in the range of about 50 to about 200 nanometers. Second insulating layer 102 then may be suitably patterned and etched using standard masking and etching techniques to form a via 104 that extends to and that substantially exposes the protective capping layer 100 overlying first copper conductor 26 but that does not result in exposure of first copper conductor 26. It will be appreciated that second insulating layer 102 may be etched to selectively form vias to the protective capping layers 100 overlying some interconnects or conductors and to leave the protective capping layers 100 overlying other interconnects and conductors, such as digit line 28, unexposed. After formation of vias 104, the exposed protective capping layers 100 may be subjected to an optional cleaning process, such as a sputtering process.

Figure 11:
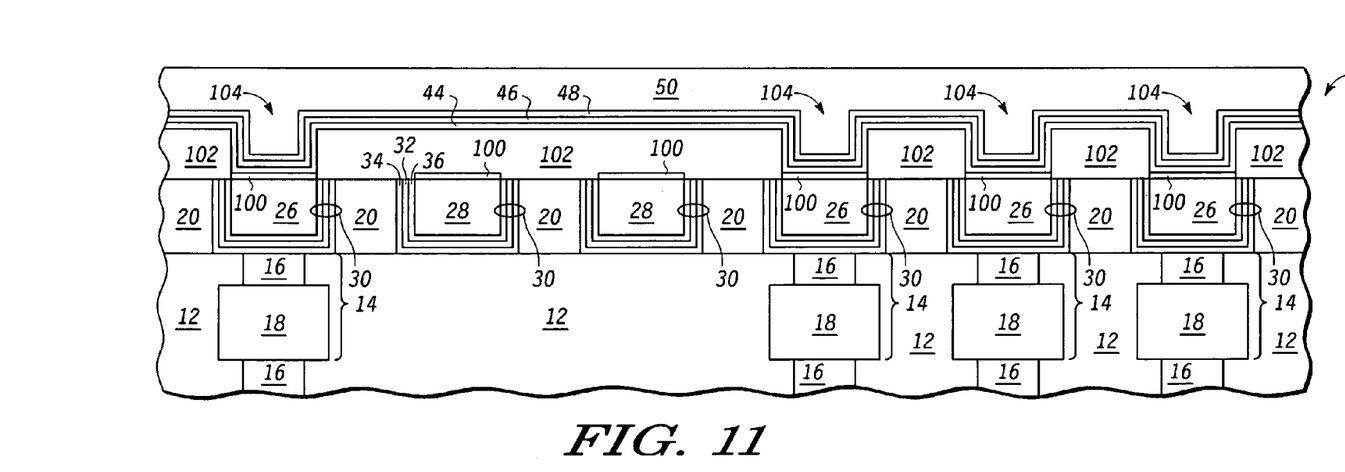
Figure 12:
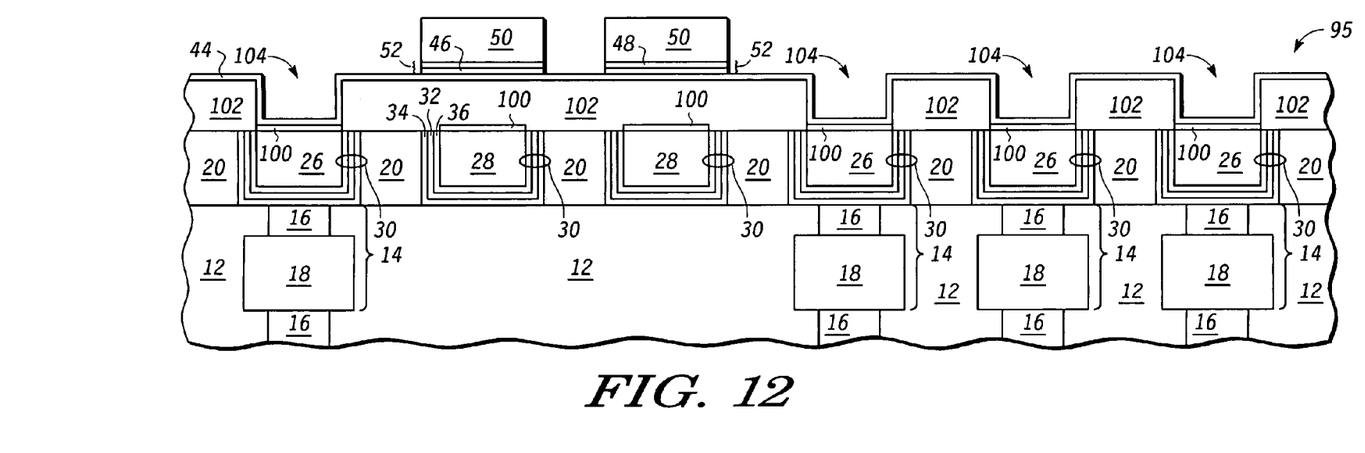

Referring to FIG. 11, a first conductive layer 44, a memory element layer 46, and a second conductive layer 48 then may be formed overlying second insulating layer 102, within vias 104, and overlying protective capping layers 100. A masking layer 50, such as a hard mask, then may be deposited overlying second conductive layer 48 and patterned and etched using standard and well-known techniques. As illustrated in FIG. 12, second conductive layer 48 and magnetic memory element layer 46 then may be suitably etched to form memory element 52 overlying digit line 28. Memory element 52 is disposed overlying digit line 28 so as to be magnetically coupled to digit line 28. In addition, memory element 52 is electrically coupled to interconnect 14 through first conductive layer 44 which extends from memory element 52 to protective capping layer 100 and, hence, to interconnect 14.

Accordingly, magnetoelectronic device structures utilizing protective capping layers overlying copper conductors and methods for fabricating such magnetoelectronic device structures have been provided. The protective capping layers protect the copper conductors from process chemistries and also protect the magnetic materials of the magnetoelectronic device structures from diffusing copper. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a magnetoelectronic device, the method comprising:
    forming a first conductor and a second conductor, wherein said first conductor is electrically coupled to an interconnect stack;
    depositing a first insulating layer overlying said first conductor and said second conductor;
    etching a via within said first insulating layer to substantially expose said first conductor;
    depositing by electroless deposition a protective capping layer within said via overlying said first conductor, said protective capping layer electrically coupled to said first conductor; and
    forming a magnetic memory element layer within said via and overlying said first insulating layer and said second conductor.

2. The method for fabricating a magnetoelectronic device of claim 1, wherein the step of forming a first conductor and a second conductor comprises the step of forming said first conductor and said second conductor of copper.

3. The method for fabricating a magnetoelectronic device of claim 1, wherein the step of forming a first conductor and a second conductor comprise:
    fabricating an interconnect stack that is disposed at least partially within a layer of dielectric material;
    depositing a second insulating layer overlying said interconnect stack and said layer of dielectric material;
    etching a first trench and a second trench within said second insulating layer, said first trench exposing said interconnect stack; and
    forming said first conductor in said first trench and said second conductor in said second trench.

4. The method for fabricating a magnetoelectronic device of claim 3, the method further comprising the step of forming a cladding layer within said first trench and said second trench before the step of forming said first conductor and said second conductor.

5. The method for fabricating a magnetoelectronic device of claim 1, wherein the step of depositing a protective capping layer comprises depositing a material layer comprising at least one selected from the group consisting of palladium, platinum, ruthenium, cobalt, nickel, tungsten, alloys of palladium, alloys of platinum, alloys of ruthenium, alloys of cobalt, alloys of nickel, and alloys of tungsten.

6. The method for fabricating a magnetoelectronic device of claim 1, further comprising the step of depositing a first conductive layer within said via and overlying said first insulating layer and said second conductor, which step is performed before the step of forming a magnetic memory element layer.

7. A method for fabricating a magnetoelectronic device, the method comprising:
    forming a first conductor and a second conductor, wherein said first conductor is electrically coupled to an interconnect stack;
    depositing a first protective capping layer overlying said first conductor and a second protective capping layer overlying said second conductor, said first and second protective capping layers deposited using an electroless deposition process;
    depositing a first insulating layer overlying said first and said second protective capping layers;
    etching a via within said first insulating layer to expose said first protective capping layer; and
    forming a magnetic memory element layer within said via and overlying said first insulating layer and said second conductor.

8. The method for fabricating a magnetoelectronic device of claim 7, wherein the step of forming a first conductor and a second conductor comprises the step of forming said first conductor and said second conductor of copper.

9. The method for fabricating a magnetoelectronic device of claim 7, wherein the step of forming a first conductor and a second conductor comprise:
  fabricating an interconnect stack that is disposed at least partially within a layer of dielectric material;
  depositing a second insulating layer overlying said interconnect stack and said layer of dielectric material;
  etching a first trench and a second trench within said second insulating layer, said first trench exposing said interconnect stack; and
  forming said first conductor in said first trench and said second conductor in said second trench.

10. The method for fabricating a magnetoelectronic device of claim 9, the method further comprising the step of forming a cladding layer within said first trench and said second trench before the step of forming said first conductor and said second conductor.

11. The method for fabricating a magnetoelectronic device of claim 7, wherein the step of depositing a protective capping layer comprises depositing a material layer comprising at least one selected from the group consisting of palladium, platinum, ruthenium, alloys of palladium, alloys of platinum, alloys of ruthenium, and nickel phosphorous.

12. The method for fabricating a magnetoelectronic device of claim 7, wherein the step of depositing a protective capping layer comprises the step of depositing a protective capping layer to a thickness of no less than about 20 nanometers.

13. The method for fabricating a magnetoelectronic device of claim 7, further comprising the step of depositing a first conductive layer within said via and overlying said first insulating layer and said second conductor, which step is performed before the step of forming a magnetic memory element layer.

14. The method for fabricating a magnetoelectronic device of claim 13, further comprising the step of etching said magnetic memory element layer so that a memory element is disposed overlying said second conductor, is magnetically coupled to said second conductor, and is electrically coupled to said first conductor by said first conductive layer and said protective capping layer.

15. A magnetoelectronic device comprising:
  a first conductor and a second conductor, wherein said first conductor is electrically coupled to an interconnect stack;
  a first protective capping layer disposed overlying said first conductor and electrically coupled to said first conductor;
  a first insulating layer disposed overlying said second conductor;
  a first conductive electrode layer disposed overlying said first insulating layer and said second conductor and electrically coupled to said first conductor through said first protective capping layer; and
  a magnetic memory element disposed overlying said first conductive electrode layer, said second insulating layer, and said second conductor, wherein said magnetic memory element is magnetically coupled to said second conductor and is electrically coupled to said first conductor via said first conductive electrode layer and said first protective capping layer.

16. The magnetoelectronic device structure of claim 15, wherein said first conductor and said second conductor comprise copper.

17. The magnetoelectronic device structure of claim 15, wherein said protective capping layer comprises at least material selected from the group consisting of palladium, platinum, ruthenium, cobalt, nickel, tungsten, alloys of palladium, alloys of platinum, alloys of ruthenium, alloys of cobalt, alloys of nickel, and alloys of tungsten.

18. The magnetoelectronic device structure of claim 15, further comprising a second protective capping layer disposed overlying said second conductor.

19. The magnetoelectronic device structure of claim 18, wherein said protective capping layer comprises at least one material selected from the group consisting of palladium, platinum, ruthenium, alloys of palladium, alloys of platinum, alloys of ruthenium, and nickel phosphorous.

20. The magnetoelectronic device structure of claim 15, wherein said first protective capping layer has a thickness of no less than about 20 nanometers.

* * * * *